(12) United States Patent
Fleischer

(10) Patent No.: US 11,221,402 B2
(45) Date of Patent: Jan. 11, 2022

(54) ACTIVE PIXEL ARRAY FOR A TIME OF FLIGHT DETECTOR

(71) Applicant: NewSight Imaging Ltd., Ness Ziona (IL)

(72) Inventor: David L. Fleischer, Jerusalem (IL)

( * ) Notice: Subject to any disclaimer, the term of this patent is extended or adjusted under 35 U.S.C. 154(b) by 450 days.

(21) Appl. No.: 16/236,662

(22) Filed: Dec. 31, 2018

(65) Prior Publication Data
US 2019/0204424 A1 Jul. 4, 2019

Related U.S. Application Data

(60) Provisional application No. 62/612,465, filed on Dec. 31, 2017.

(51) Int. Cl.
| | | |
|---|---|---|
| *G01S 7/4914* | (2020.01) | |
| *G01S 17/894* | (2020.01) | |
| *G01S 7/4863* | (2020.01) | |
| *G01S 7/486* | (2020.01) | |
| *H04N 5/378* | (2011.01) | |
| *H01L 27/146* | (2006.01) | |
| *G01S 7/4915* | (2020.01) | |

(52) U.S. Cl.
CPC .......... *G01S 7/4914* (2013.01); *G01S 7/4863* (2013.01); *G01S 7/4868* (2013.01); *G01S 7/4915* (2013.01); *G01S 17/894* (2020.01); *H01L 27/14643* (2013.01); *H04N 5/378* (2013.01)

(58) Field of Classification Search
CPC .............................. G01S 17/894; G01S 7/4915
See application file for complete search history.

(56) References Cited

U.S. PATENT DOCUMENTS

| | | | |
|---|---|---|---|
| 2013/0120735 A1* | 5/2013 | Mase | G01S 7/4863 356/4.01 |
| 2016/0198109 A1* | 7/2016 | Ishii | H04N 5/37457 348/302 |
| 2017/0194370 A1* | 7/2017 | Mase | G01S 17/89 |

* cited by examiner

*Primary Examiner* — Thanh Luu
(74) *Attorney, Agent, or Firm* — Patshegen IP LLC; Moshe Pinchas

(57) ABSTRACT

An active pixel sensor having an array of pixel elements arranged in columns is provided. Each pixel element including: an active area including at least one photodiode being configured to detect light pulses having a predefined time duration; a first and second floating diffusion region coupled to the active area and being configured for readout of charges accumulating in the active area; a controller configured to independently control the readout of the first and the second floating diffusion regions, and to conduct a first readout of the active area by the first floating diffusion region and a second readout of the active area by the first floating diffusion region; wherein the first readout is conducted at a first timepoint with respect to the time duration and the second readout is conducted at a second timepoint with respect to the time duration.

10 Claims, 4 Drawing Sheets

ACTIVE PIXEL ARRAY FOR A TIME OF FLIGHT DETECTOR

FIELD OF INVENTION

The presently disclosed subject matter relates to an active pixel array in general, and in particular to an active pixel array for a time of flight detector.

BACKGROUND

Vehicle autonomy and driver assistance systems rely on the ability to detect objects at various distances in relation to the vehicle, in order to determine the distance between the vehicle and the object; and in order to identify the potential objects such as pedestrians and cyclists, motor vehicles, side strips, bridge abutments, road margins, etc.

Light Detection and Ranging systems (LiDAR) are one of the technologies which are used in autonomous vehicles for assessing distances. In the LiDAR systems a target is illuminated with a pulsed laser light, and the reflected pulse is measured.

As shown in FIG. 1, The LiDAR system is configured to send out light pulses 10, such as a 50 ns pulses, which are reflected by objects in front of the system and are subsequently detected by the detector of the LiDAR system as reflected pulses 12. Due to the effect of time of flight, the reflected pulse 12 arrives back at the detector of the LiDAR system at a time delay 14, which is proportional to the distance between the LiDAR system and the detected object. The first readout of the detector is carried out at the end of each of the emitted pulses 10, e.g. at the end of the 50 ns time slot 16. Due to the delay of the reflected pulse 12, only a front section 20a of the reflected pulse 12, reaches the detector before the readout occurs. Accordingly, within the timeslot of the 50 ns pulse the detector reads only a portion 20a of the reflected pulse 12.

The remaining portion 20b of the reflected pulse 12, i.e. the portion of the reflected pulse 12 which reaches the detector after the end of the emitted pulses 10, e.g. at the end of the 50 ns time slot 16. Thus, the readout of the remaining portion 20b can be carried out at the beginning of a successive pulse 18. This way the LiDAR system obtains the portions 20a of the reflected pulse 12 which is received within the time of the emitted pulse 10, and the remaining portion 20b which is received within the time of the emitted pulse 10.

The distance can be calculated using the equation, $$D = \frac{1}{2} c \, t_0 \frac{S_2}{S_1 + S_2}$$

for an ideal detector. Where c is the speed of light; $t_0$ is the pulse width; i.e. the pulse duration; $S_1$ is the amount of the light which is received by the detector at the timeslot of the emitted pulse 10, here designated as 20a; and $S_2$ is the amount of the light pulse which is detected after the end of the emitted pulse 10, here designated as 20b.

This way, the two readouts provide both components of the reflected pulse 12 $S_1$ and $S_2$, and the distance of the object can be calculated with the above equation.

SUMMARY OF INVENTION

There is provided in accordance with an aspect of the presently disclosed subject matter an active pixel sensor having an array of pixel elements arranged in columns, each pixel element including: an active area including at least one photodiode being configured to detect light pulses having a predefined time duration; a first floating diffusion region coupled to the active area and being configured for readout of charges accumulating in the active area; a second floating diffusion region coupled to the active area and being configured for readout of charges accumulating in the active area; a controller configured to independently control the readout of the first floating diffusion region and the second floating diffusion region, and to conduct a first readout of the active area by the first floating diffusion region and a second readout of the active area by the first floating diffusion region; wherein the first readout is conducted at a first timepoint with respect to the time duration and the second readout is conducted at a second timepoint with respect to the time duration.

The first timepoint and the second timepoint can be determined such that each one of the first and second floating diffusion regions reads different portions of light pulses impinging on the active area.

The pixel elements can be arranged in columns along a first dimension of the array such that the resolution of the array is proportional to the number of columns along the first dimension.

The active area can include at least one first photodiode and at least one second photodiode arranged along the columns of the array. The at least one first photodiode can be coupled to the first floating diffusion region and the at least one second photodiode is coupled to the second floating diffusion region, such that the first photodiode is configured to emit charges into the first floating diffusion region and the second photodiode configured to emit charges into the second floating diffusion region.

The array can include a first and second rows of photodiodes, the first and second rows are disposed along a second dimension of the array increasing thereby the active area of each pixel. The at least one first photodiode can include one first photodiode disposed on the first row and another first photodiode disposed on the second row, and the at least one second photodiode includes one second photodiode disposed on the first row and another second photodiode disposed on the second row.

The two first photodiodes can be coupled to the first floating diffusion region and the two second photodiodes are coupled to the second floating diffusion region.

The at least one photodiode can be coupled to the first floating diffusion region and to the second floating diffusion region, and wherein the controller can be configured for selectively readout charges in the at least one photodiode by the first floating diffusion region or by the second floating diffusion region.

There is provided in accordance with another aspect of the presently disclosed subject matter an active pixel sensor including: an array of a plurality of first, second and third photodiodes disposed along a first dimension of the array; a plurality of first floating diffusion regions each of which being configured to selectively readout charges from a first pair of photodiodes including of one of the first photodiodes and one of the second photodiodes; a plurality of second floating diffusion regions each of which being configured to selectively readout charges from a second pair of photodiodes including of one of the second photodiodes and one of the third photodiodes; and a controller configured to selectively actuate a first readout of the plurality of first floating diffusion regions and to actuate a second readout of the plurality of second floating diffusion regions.

The active pixel sensor can be such that during the first readout charges from the first pair are counted as single pixel, and during the second readout charges from the second pair are counted as single pixel.

There is provided in accordance with yet another aspect of the presently disclosed subject matter a time of flight detector including: a light source configured to emit light pulses having a time duration; an array of pixel elements each of which including an active area having at least one photodiode being configured to detect the light pulses; a first floating diffusion region coupled to the active area and being configured for readout of charges accumulating in the active area; a second floating diffusion region coupled to the active area and being configured for readout of charges accumulating in the active area; and a controller configured to independently control the readout of the first floating diffusion region and the second floating diffusion region, and to conduct a first readout of the active area by the first floating diffusion region and a second readout of the active area by the first floating diffusion region; wherein the first readout is conducted at a first timepoint with respect to the time duration and the second readout is conducted at a second timepoint with respect to the time duration.

The first timepoint and the second timepoint are determined such that each one of the first and second floating diffusion regions reads different portions of light pulses impinging on the active area.

The first timepoint can be at the end of the time duration and the second timepoint is prior to emittance of a successive light pulse by the light source.

The active area can include at least one first photodiode and at least one second photodiode arranged along the columns of the array.

The at least one first photodiode can be coupled to the first floating diffusion region and the at least one second photodiode is coupled to the second floating diffusion region, such that the first photodiode is configured to emit charges into the first floating diffusion region and the second photodiode configured to emit charges into the second floating diffusion region.

The first timepoint can be at the end of the time duration and the second timepoint is configured such that the second detects the entire light pulse before the second readout.

The light source can be configured to emit light pulses towards a distanced object and wherein the at least one photodiode being configured to detect the light pulses after reflecting back from the distance object.

BRIEF DESCRIPTION OF THE DRAWINGS

In order to understand the disclosure and to see how it may be carried out in practice, embodiments will now be described, by way of non-limiting examples only, with reference to the accompanying drawings, in which.

DETAILED DESCRIPTION OF EMBODIMENTS

Figure 2:
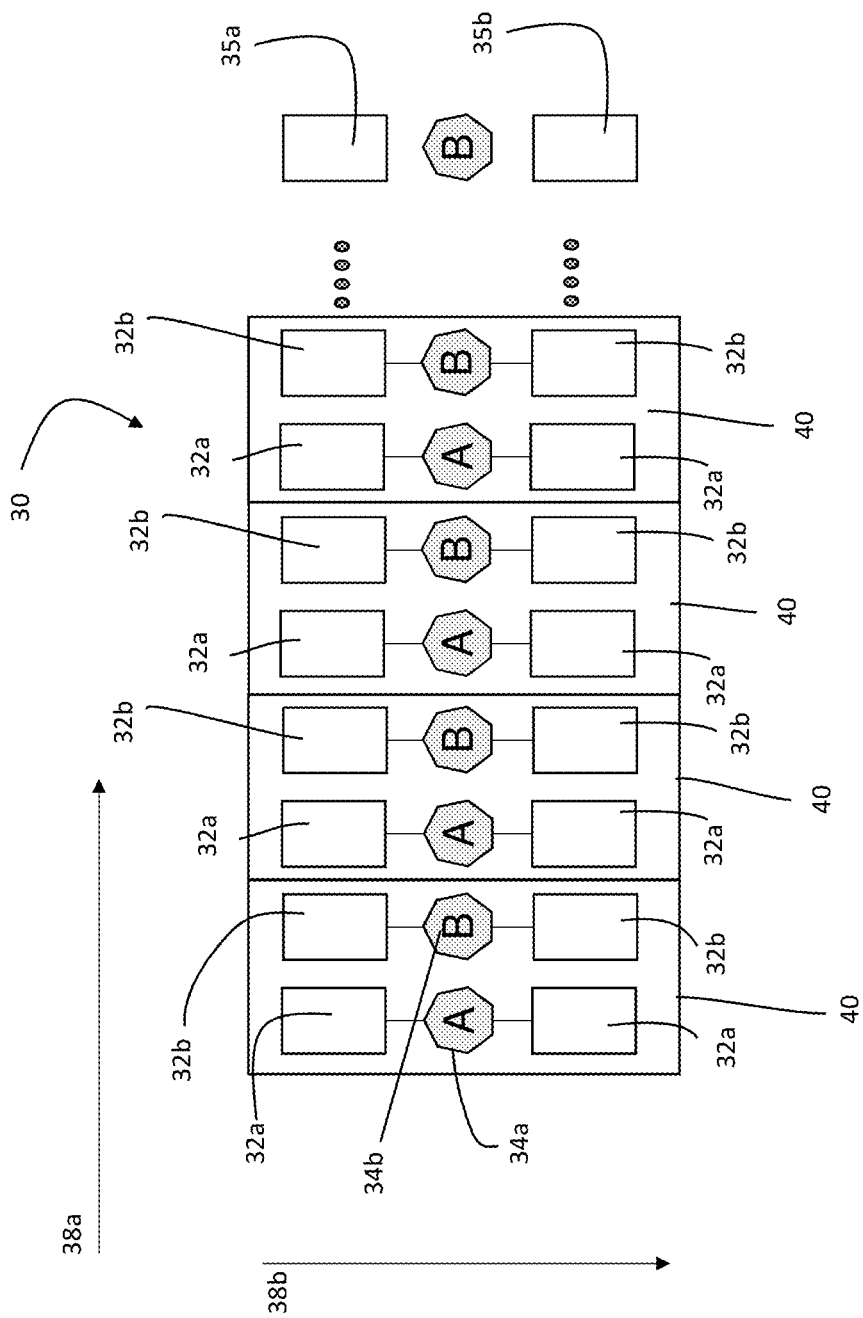
FIG. 2 is a schematic illustration of a array of pixel element in accordance with an example of the presently disclosed subject matter.

FIG. 2 shows a detector 30 according to the presently disclosed subject matter. The detector 30 includes an array of pixel element 40 arranged in columns along a first dimension 38a, thus providing a resolution proportional to the number of columns along the first dimension. Each pixel element 40 includes a first photodiode 32a disposed on a first column and being coupled to a first floating diffusion region 34a, and a second photodiode 32b disposed on a second column and being coupled to a second floating diffusion region 34b.

According to the illustrated example, the array includes two rows 35a and 35b of photodiodes arranged along a second dimension 38b increasing thereby the active area of each pixel. Thus, each pixel element 40 includes two first photodiodes 32a disposed on the first column of the pixel elements 40, however one disposed on the first row 35a and another disposed on the second row 35b. The two first photodiodes 32a are coupled to a first floating diffusion region 34a such that the first photodiodes 32a are configured to emit charges into the first floating diffusion region.

Similarly, each pixel element 40 includes two second photodiode 32b, disposed on the second column of the pixel element 40, however one disposed on the first row 35a and another disposed on the second row 35b. The two second photodiodes 32b are coupled to a second floating diffusion region 34b such that the second photodiodes 32b are configured to emit charges into the first floating diffusion region.

The detector 30 can be used in a time of flight detector, such as LiDAR system, and can include a controller configured to control the readout time of the first and second floating diffusion regions 34a and 34b such that the readout time of the first floating diffusion region 34a is different than the readout time of the second floating diffusion region 34b. Accordingly, when the detector 30 is configured to detected reflected pulses each one of the first and second floating diffusion regions 34a and 34b reads different portions of light pulses impinging on the sensor.

Figure 1:
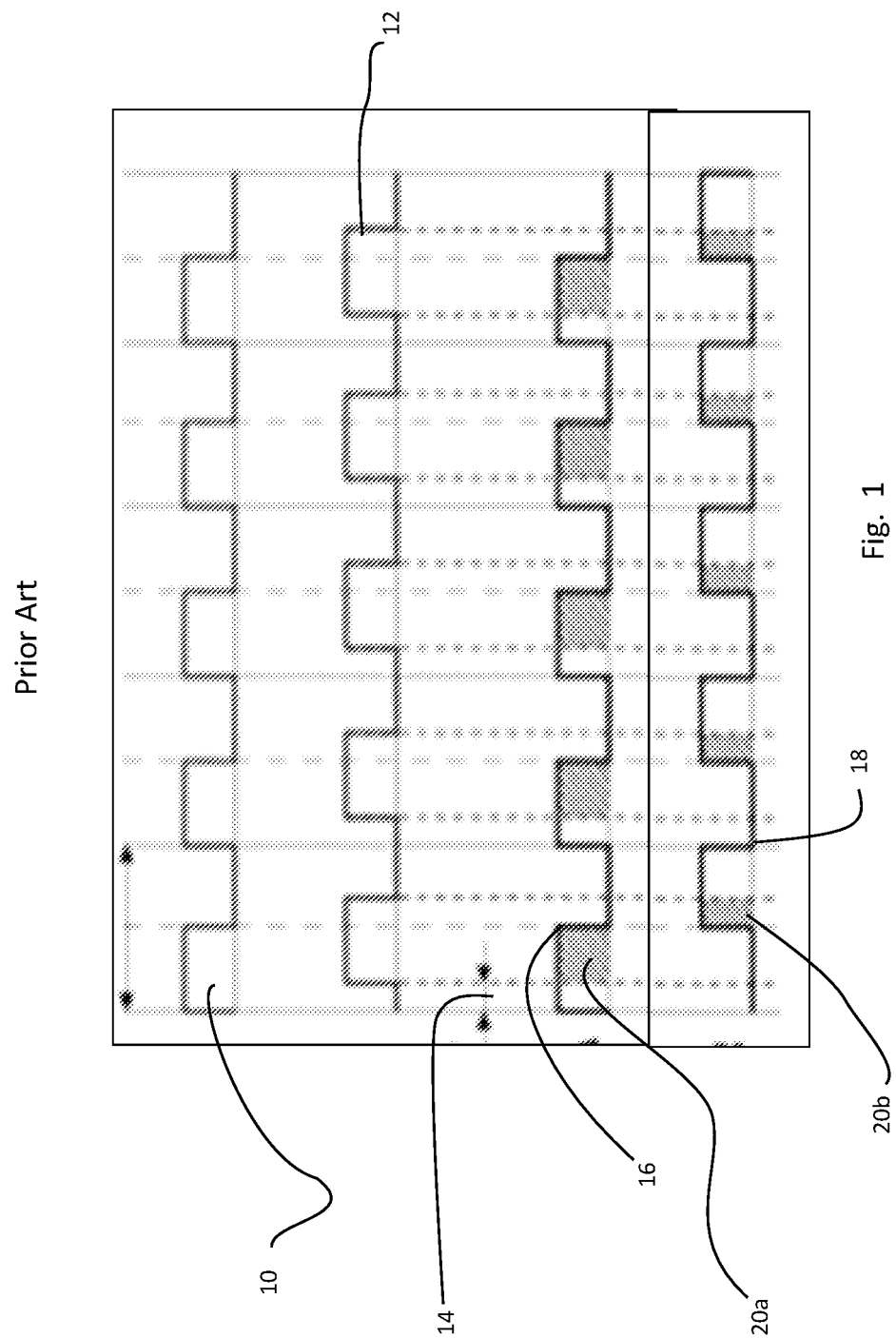
FIG. 1 is a graph illustration of the prior art timing diagram of a light pulse detection.

That is to say, the detector 30 can be used in a range imaging camera and can be configured to detect a front portion of a light pulse (i.e. section 20a of the pulse illustrated in FIG. 1), and a back portion thereof (i.e. section 20b of the pulse illustrated in FIG. 1), by performing two readouts of the photodiodes. In other words, instead of using a mechanical shutter for modulating the reflected pulse, or instead of performing two readouts of the same floating diffusion region, two floating diffusion regions 34a and 34b are utilized for readout of the electrons accumulating in the photodiodes at a predetermined time slot.

Accordingly, if, for example, the light pulse emitted by the LiDAR system is a 50 ns pulse, the readout of the first photodiodes 32a can be carried out at the end of the 50 ns time slot, by synchronizing the light pulse via the readout of the first floating diffusion regions 34a of the pixel element 40 of the detector 30.

Due to the time of flight of the pulse, however, only a front section of the reflected pulse reaches the photodiode, before the readout of the first floating diffusion regions 34a occurs. Accordingly, within the timeslot of the 50 ns pulse the photodiodes accumulate only a front portion of the reflected pulse, (i.e. section 20a of the pulse illustrated in FIG. 1). Thus, the back portion (i.e. section 20b of the pulse illustrated in FIG. 1), of the light pulse which did not reach the photodiodes during the 50 ns time slot can reach the photodiodes 32a and 32b after the readout of the first floating diffusion regions 34a. Since the readout of the first floating diffusion regions 34a is carried out only with respect to the first photodiodes 32a of each pixel element 40, the charges in the second photodiodes 32b of each pixel element 40 remains in the second photodiodes 32b.

Thus, following the initial readout of the photodiodes at the end of the 50 ns time slot, a second readout can be carried out by the second floating diffusion regions 34b after a predetermined time period, for example, another 50 ns time slot. The second readout provides the readout of the charges accumulated in the second photodiodes 32b of each pixel element 40, which includes the charges accumulated as a result of the entire reflected light pulse. This is since the second photodiodes 32b are not affected by the readout of the first floating diffusion regions 34a.

Accordingly when utilizing the above equation, $$D = \frac{1}{2} c \; t_0 \frac{S_2}{S_1 + S_2}$$

the distance D can be calculated, by substituting $S_1$ with the readout of the first floating diffusion regions 34a, which provides the amount of the reflected light received by the first photodiodes 32a of each pixel element 40 at the timeslot of the emitted pulse, and by substituting $S_1+S_2$ with the readout of the second floating diffusion regions 34b which provide data with respect to the charges accumulated in the second photodiodes 32b of each pixel element 40, i.e. charges accumulated as a result of the entire reflected light pulse.

Figure 3:
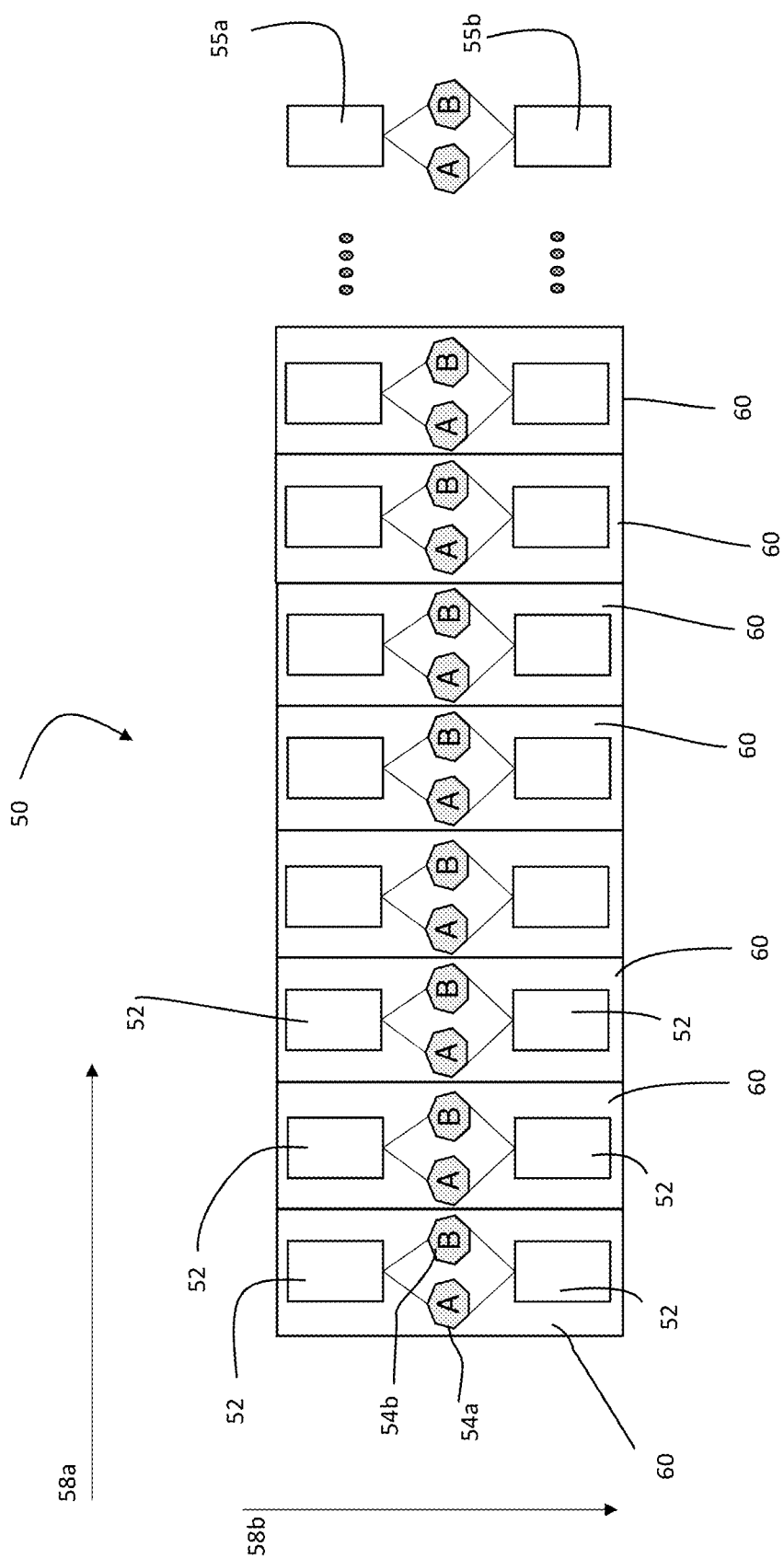
FIG. 3 is a schematic illustration of an array of pixel element in accordance with another example of the presently disclosed subject matter.

According to another example, shown in FIG. 3, the detector 50 can include an array of pixel element 60 arranged in columns along a first dimension 58a, thus providing a resolution proportional to the number of columns along the first dimension. According to the illustrated example the array includes two rows 55a and 55b of photodiodes arranged along a second dimension 58b increasing thereby the active area of each pixel.

Each pixel element 60 includes at least one photodiode 52, here illustrated as two photodiodes 52 each of which disposed on one of the rows 55a or 55b. Contrary to the detector 30 of FIG. 2, according this example, each pixel element 60 includes one column with only first photodiodes 52. According to the present example, however, the photodiodes 52 are coupled to a first floating diffusion region 54a as well as to a second floating diffusion region 54b. The photodiodes 52 are configured to selectively emit charges into the first or second floating diffusion regions 54a and 54b. For example, the readout of either the first or second floating diffusion regions 54a and 54b can be carried out by utilizing a gating device, which allows selectively activating either one of the floating diffusion regions 54a and 54b to release all the charges accumulating in the photodiode 52.

The active pixel sensor 50 can be used in a time of flight detector, such as LiDAR system, and can be configured such that the readout time of the first floating diffusion region 54a is different than the readout time of the second floating diffusion region 54b. Accordingly, when the detector 50 is configured to detect reflected pulses each one of the first and second floating diffusion regions 54a and 54b reads different portions of light pulses impinging on the sensor.

That is to say, the detector of the range imaging camera is configured to detect a front portion of a light pulse (i.e. section 20a of the pulse illustrated in FIG. 1), and a back portion thereof (i.e. section 20b of the pulse illustrated in FIG. 1), by performing two readouts of the photodiodes. In other words, if the light pulse emitted by the LiDAR system is a 50 ns pulse, the readout of the photodiodes 52 can be carried out at the end of the 50 ns time slot, synchronized with the light pulse, such that all the front portion of the reflected pulse is read by the first floating diffusion regions 54a, thereby obtaining the $S_1$ parameter of the above equation. Before the beginning of the successive emitted pulse, a second readout is carried out by the second floating diffusion region 54b. Since according to the present example, the second floating diffusion region 54b is coupled to the same photodiodes 52, which are also coupled to the first floating diffusion region 54a, the charges formed by the front portion of the reflected pulse are already discharged into the first floating diffusion region 54a. Thus, the second floating diffusion region 54b reads only the charges of the remaining portion of the reflected pulse, i.e. the back portion of the reflected pulse which did not make it back to the detector within the timeslot of the emitted pulse due to the time of flight effect. Accordingly, the charges read by the second floating diffusion regions 54b, allow obtaining the $S_2$ parameter of the above equation. This is as opposed to the second floating diffusion regions 34a of the detector 30 of FIG. 2, which is coupled to the second photodiodes 32b of each pixel element 40, and which is configured to readout charges accumulated as a result of the entire reflected light pulse.

Figure 4:
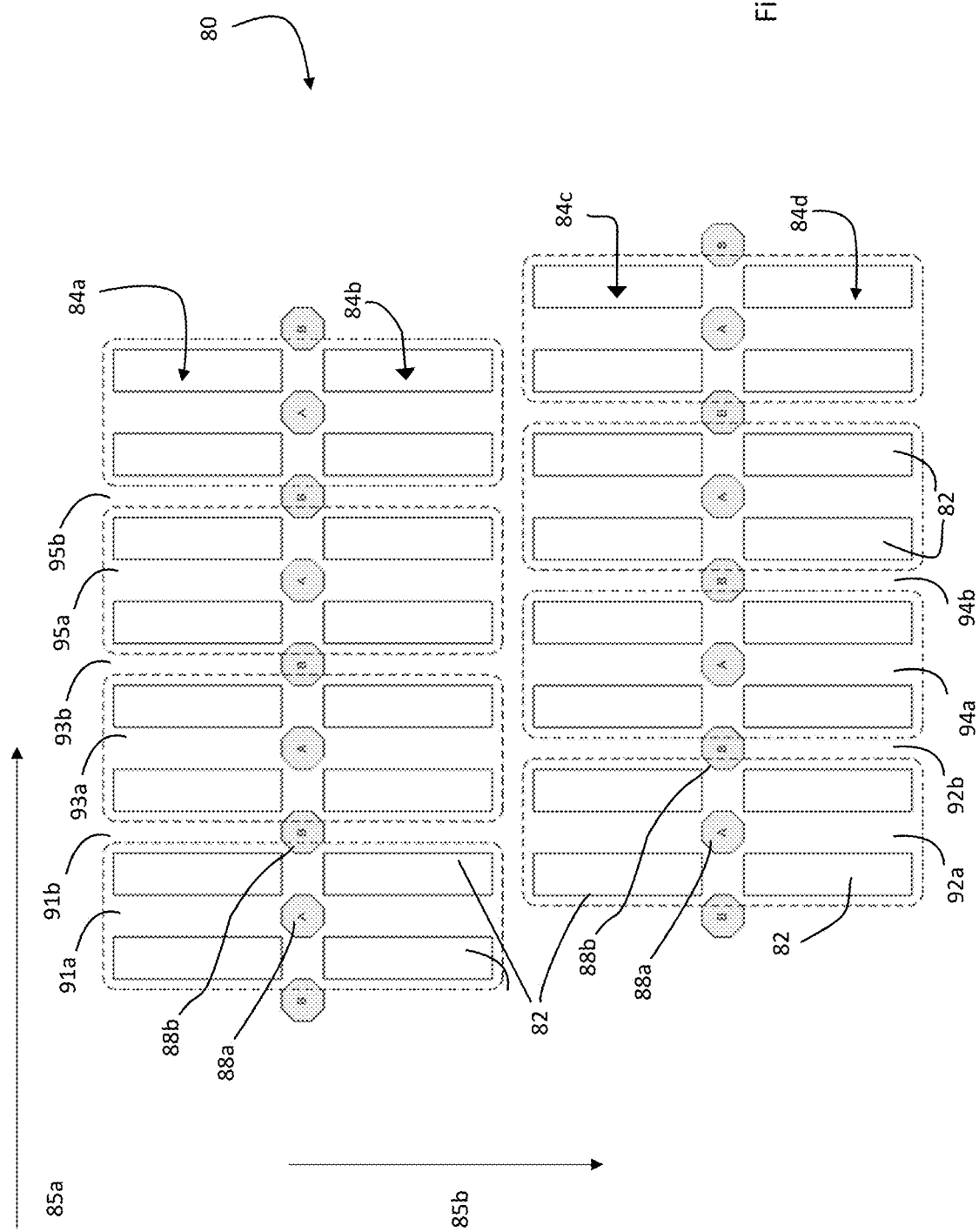
FIG. 4 is a schematic illustration of an array of pixel element in accordance with yet another example of the presently disclosed subject matter.

FIG. 4 illustrates an array of photodiodes 80 according to yet another example of the presently disclosed subject matter. The array 80 includes a plurality of photodiodes 82 arranged in a two-dimensional arrangement. I.e. the photodiodes 82 are disposed in a four rows 84a-84d arranged along a first dimension 85a of the array 80.

As described in WO/2018/096546, which is incorporated herein by reference, in order to further increase the sensitivity of the array 80, the photodiodes 82 are grouped into multiple-pixel pixel groups 91a, 92a, 93a etc., each having a first floating diffusion region 88a configured to store charges from the photodiodes in the group, allowing readout of the entire group through the binning operation. In addition, in order not to reduce the resolution of the array 80, the pixel groups 91a, 92a, 93a are arranged in an overlapping arrangement along first dimension 85a of the array 80, by disposing the pixel groups on either first and second rows 84a and 84b or on the third and fourth rows 84c-84d in an alternating arrangement. According to the present invention however, the array 80 further includes a plurality of second floating diffusion regions 88b alternately arranged with the first floating diffusion regions 88a along the first dimension 85a of the array.

The photodiodes 82 in the array 80 are configured such that each adjacent pixel can be configured to release charges thereof either into the first floating diffusion region 88a or the second floating diffusion region 88b. That is to say, similar to the photodiodes 52 of the active pixel sensor 50 of FIG. 3, which can be selectively be coupled for readout by either the first or second floating diffusion regions 54a and 54b, the photodiodes 82 of the present array can be configured to selectively release charges thereof into the first floating diffusion region 88a or the second floating diffusion regions 88b.

According to the present example however, since each pixel group 91a, 92a, 93a includes photodiodes disposed on to columns, the pixel groups are dynamically defined. In other words, the photodiodes 82 in the array 80 are configured such that four adjacent pixels can be dynamically grouped around either the first floating diffusion region 88a or the second floating diffusion region 88b. As shown in FIG. 4, the first floating diffusion regions 88a are associated with pixel groups 91a, 92a, 93a etc., and the second floating diffusion regions 88b are associated with pixel groups 91b, 92b, 93b etc. The photodiodes 82 can be dynamically defined as part of groups associated with the first floating diffusion regions 88*a* or as part of groups associated with the second floating diffusion regions 88*b*.

Accordingly, in one instance the photodiodes 82 can be grouped in a first group arrangement into groups 91*a*, 92*a*, 93*a* etc. and release charges thereof into the first floating diffusion region 88*a* associated with the pixel group. In another instance the photodiodes 82 can be grouped in a second group arrangement into groups 91*b*, 92*b*, 93*b* around the second floating diffusion regions 88*b* associated with each of the pixel groups, and release charges thereto.

The array can thus be arranged that the first and second floating diffusion regions 88*a* and 88*b* are arranged in an alternating pattern, along the array 80. This way, the array 80 can be utilized to selectively detect either the front portion of the reflected pulse or the back portion of the reflected pulse. I.e., in a first instance the photodiodes 82 release charges into the first floating diffusion regions 88*a* and the readout of the front portion of the pulse is obtained, and in a second instance the photodiodes 82 release charges into the second floating diffusion regions 88*b* and the readout of the back portion of the pulse is obtained. Since, the photodiodes 82 are dynamically grouped, the pixels slightly shifted along the array, between the readout of the first and second floating diffusion regions 88*a* and 88*b*.

In addition, the array can be arranged such that the sensitivity thereof is increased by providing more columns of photodiodes per pixels without compromising on the resolution of the array. At the same time the array allows separate readouts of different portions of reflected pulses of a time of flight camera. I.e. the portion which is received within the time of the emitted pulse is read at the first floating diffusion region 88*a*, while the second floating diffusion is read before the second pulse, such that the entire reflected pulse is detected by the pixel array.

Those skilled in the art to which the presently disclosed subject matter pertains will readily appreciate that numerous changes, variations, and modifications can be made without departing from the scope of the invention, mutatis mutandis.

The invention claimed is:

1. An active pixel sensor having an array of pixel elements arranged in columns along a first dimension of the array, each pixel element comprising:
   an active area including at least one first photodiode and at least one second photodiode arranged along the columns of the array said first and second photodiodes being configured to detect light pulses having a predefined time duration;
   a first floating diffusion region coupled to said at least one first photodiode and being configured for readout of charges accumulating in said at least one first photodiode;
   a second floating diffusion region coupled to said at least one second photodiode and being configured for readout of charges accumulating in said at least one second photodiode; and
   a controller configured to independently control the readout of said first floating diffusion region and said second floating diffusion region, and to conduct a first readout of the active area by the first floating diffusion region and a second readout of the active area by the second floating diffusion region;
   wherein the first readout is conducted at a first timepoint with respect to said time duration and the second readout is conducted at a second timepoint with respect to said time duration;
   wherein said array includes a first and second rows of photodiodes, said first and second rows are disposed along a second dimension of the array increasing thereby the active area of each pixel; and
   wherein said at least one first photodiode includes one first photodiode disposed on the first row and another first photodiode disposed on the second row, and said at least one second photodiode includes one second photodiode disposed on the first row and another second photodiode disposed on the second row.

2. The active pixel sensor of claim 1 wherein said first timepoint and said second timepoint are determined such that each one of the first and second floating diffusion regions reads different portions of light pulses impinging on the active area.

3. The active pixel sensor of claim 1 wherein said columns are arranged along the first dimension of the array such that the resolution of the array is proportional to number of columns along the first dimension.

4. The active pixel sensor of claim 1 wherein the two first photodiodes are coupled to said first floating diffusion region and the two second photodiodes are coupled to said second floating diffusion region.

5. The active pixel sensor of claim 1 wherein said at least one first photodiode is further coupled to said second floating diffusion region, and wherein said controller is configured for selectively readout charges in said at least one first photodiode by the first floating diffusion region or by the second floating diffusion region.

6. A time of flight detector comprising:
   a light source configured to emit light pulses having a time duration;
   an array of pixel elements arranged in columns along a first dimension of the array, each of which including an active area having at least one first photodiode and at least one second photodiode arranged along the columns of the array and being configured to detect said light pulses;
   a first floating diffusion region coupled to said at least one first photodiode and being configured for readout of charges accumulating in said at least one first photodiode;
   a second floating diffusion region coupled to said at least one second photodiode and being configured for readout of charges accumulating in said at least one second photodiode;
   a controller configured to independently control the readout of said first floating diffusion region and said second floating diffusion region, and to conduct a first readout of the active area by the first floating diffusion region and a second readout of the active area by the second floating diffusion region;
   wherein the first readout is conducted at a first timepoint with respect to said time duration and the second readout is conducted at a second timepoint with respect to said time duration;
   wherein said array includes a first and second rows of photodiodes, said first and second rows are disposed along a second dimension of the array increasing thereby the active area of each pixel; and
   wherein said at least one first photodiode includes one first photodiode disposed on the first row and another first photodiode disposed on the second row, and said at least one second photodiode includes one second photodiode disposed on the first row and another second photodiode disposed on the second row.

7. The active pixel sensor of claim 6 wherein said first timepoint and said second timepoint are determined such that each one of the first and second floating diffusion regions reads different portions of light pulses impinging on the active area.

8. The active pixel sensor of claim 6 wherein said first timepoint is at the end of said time duration and said second timepoint is prior to emittance of a successive light pulse by said light source.

9. The active pixel sensor of claim 6 wherein said first timepoint is at the end of said time duration and said second timepoint is configured such that said second detects the entire light pulse before said second readout.

10. The active pixel sensor of claim 6 wherein said light source is configured to emit said light pulses towards a distanced object and wherein said at least one photodiode being configured to detect said light pulses after reflecting back from said distance object.

* * * * *